(12) United States Patent
Howard et al.

(10) Patent No.: US 9,966,301 B2
(45) Date of Patent: May 8, 2018

(54) REDUCED SUBSTRATE EFFECTS IN MONOLITHICALLY INTEGRATED RF CIRCUITS

(71) Applicant: Newport Fab, LLC, Newport Beach, CA (US)

(72) Inventors: David J. Howard, Irvine, CA (US); Michael J. DeBar, Tustin, CA (US); Paul D. Hurwitz, Irvine, CA (US)

(73) Assignee: New Fab, LLC, Newport Beach, CA (US)

( * ) Notice: Subject to any disclaimer, the term of this patent is extended or adjusted under 35 U.S.C. 154(b) by 0 days. days.

(21) Appl. No.: 15/193,598

(22) Filed: Jun. 27, 2016

(65) Prior Publication Data
US 2017/0372945 A1    Dec. 28, 2017

(51) Int. Cl.
| | | |
|---|---|---|
| *H01L 21/30* | (2006.01) | |
| *H01L 21/46* | (2006.01) | |
| *H01L 21/00* | (2006.01) | |
| *H01L 21/762* | (2006.01) | |
| *H01L 21/304* | (2006.01) | |
| *H01L 21/306* | (2006.01) | |
| *H01L 23/367* | (2006.01) | |
| *H01L 23/373* | (2006.01) | |
| *H01L 21/84* | (2006.01) | |

(52) U.S. Cl.
CPC ...... *H01L 21/76251* (2013.01); *H01L 21/304* (2013.01); *H01L 21/30604* (2013.01); *H01L 21/84* (2013.01); *H01L 23/367* (2013.01); *H01L 23/3731* (2013.01)

(58) Field of Classification Search
CPC ......... H01L 21/76; H01L 21/30; H01L 21/84; H01L 23/36; H01L 23/37

USPC .................. 438/458, 125; 257/705
See application file for complete search history.

(56) References Cited

U.S. PATENT DOCUMENTS

| | | | |
|---|---|---|---|
| 6,627,953 B1 | 9/2003 | Vu | |
| 8,324,082 B1 * | 12/2012 | Liu | ........ H01L 25/167 257/678 |
| 9,589,917 B1 | 3/2017 | Rodriguez | |
| 2003/0025118 A1 | 2/2003 | Yamazaki | |

(Continued)

OTHER PUBLICATIONS

Thermal expansion of AlN, sapphire, and silicon, w. M. Vim and R. J. Paff, RCA Laboratories, Princeton, New Jersey 08540 (Received Sep. 6, 1973), pp. 1456-1457.

*Primary Examiner* — Sheikh Maruf
(74) *Attorney, Agent, or Firm* — Farjami & Farjami LLP

(57) ABSTRACT

A method of forming a semiconductor structure is disclosed. The method includes forming a semiconductor wafer having a device layer situated over a handle substrate, the device layer having at least one semiconductor device, forming a front side glass on a front side of the semiconductor wafer, and partially removing the handle substrate from a back side of the semiconductor wafer. The method also includes removing a portion of the semiconductor wafer from an outer perimeter thereof, either by sawing an edge trim trench through the handle substrate, the device layer and into the front side glass to form a ring, and removing the ring on the outer perimeter of the semiconductor wafer, or by edge grinding the outer perimeter of the semiconductor wafer. The method further includes completely removing the handle substrate.

19 Claims, 16 Drawing Sheets

(56) References Cited

U.S. PATENT DOCUMENTS

| | | | |
|---|---|---|---|
| 2003/0077885 A1* | 4/2003 | Aspar | H01L 21/76254 438/517 |
| 2003/0217805 A1* | 11/2003 | Takayama | H01L 21/2007 156/249 |
| 2006/0030122 A1* | 2/2006 | Shimoda | G02F 1/13454 438/455 |
| 2006/0038182 A1* | 2/2006 | Rogers | B82Y 10/00 257/77 |
| 2008/0000871 A1* | 1/2008 | Suh | B82Y 10/00 216/2 |
| 2008/0108171 A1* | 5/2008 | Rogers | B81C 1/0046 438/73 |
| 2008/0248251 A1* | 10/2008 | Ghyselen | H01L 21/3148 428/156 |
| 2008/0277778 A1* | 11/2008 | Furman | H01L 21/2007 257/713 |
| 2008/0318367 A1* | 12/2008 | Shimomura | H01L 21/26506 438/151 |
| 2009/0004821 A1* | 1/2009 | Shimomura | H01L 21/76254 438/458 |
| 2010/0155932 A1* | 6/2010 | Gambino | G06F 17/5068 257/698 |
| 2010/0224882 A1 | 9/2010 | Lee | |
| 2010/0317132 A1* | 12/2010 | Rogers | H01L 25/0753 438/27 |
| 2011/0117726 A1* | 5/2011 | Pinnington | H01L 21/02389 438/458 |
| 2013/0248879 A1* | 9/2013 | Gambin | H01L 23/3732 257/77 |
| 2014/0001626 A1 | 1/2014 | Yamazaki | |
| 2015/0084044 A1 | 3/2015 | Tanaka et al. | |
| 2015/0137238 A1 | 5/2015 | Tsunemi | |
| 2016/0071958 A1* | 3/2016 | Liu | H01L 21/02381 257/76 |
| 2016/0276209 A1* | 9/2016 | Usenko | H01L 21/76254 |
| 2016/0308010 A1 | 10/2016 | Viswanathan | |
| 2016/0336344 A1* | 11/2016 | Mason | H01L 27/1203 |
| 2016/0372628 A1* | 12/2016 | Henley | H01L 33/007 |
| 2017/0051883 A1* | 2/2017 | Raring | H01S 5/005 |
| 2017/0200850 A1 | 7/2017 | Lee | |
| 2017/0207142 A1 | 7/2017 | Viswanathan | |

\* cited by examiner

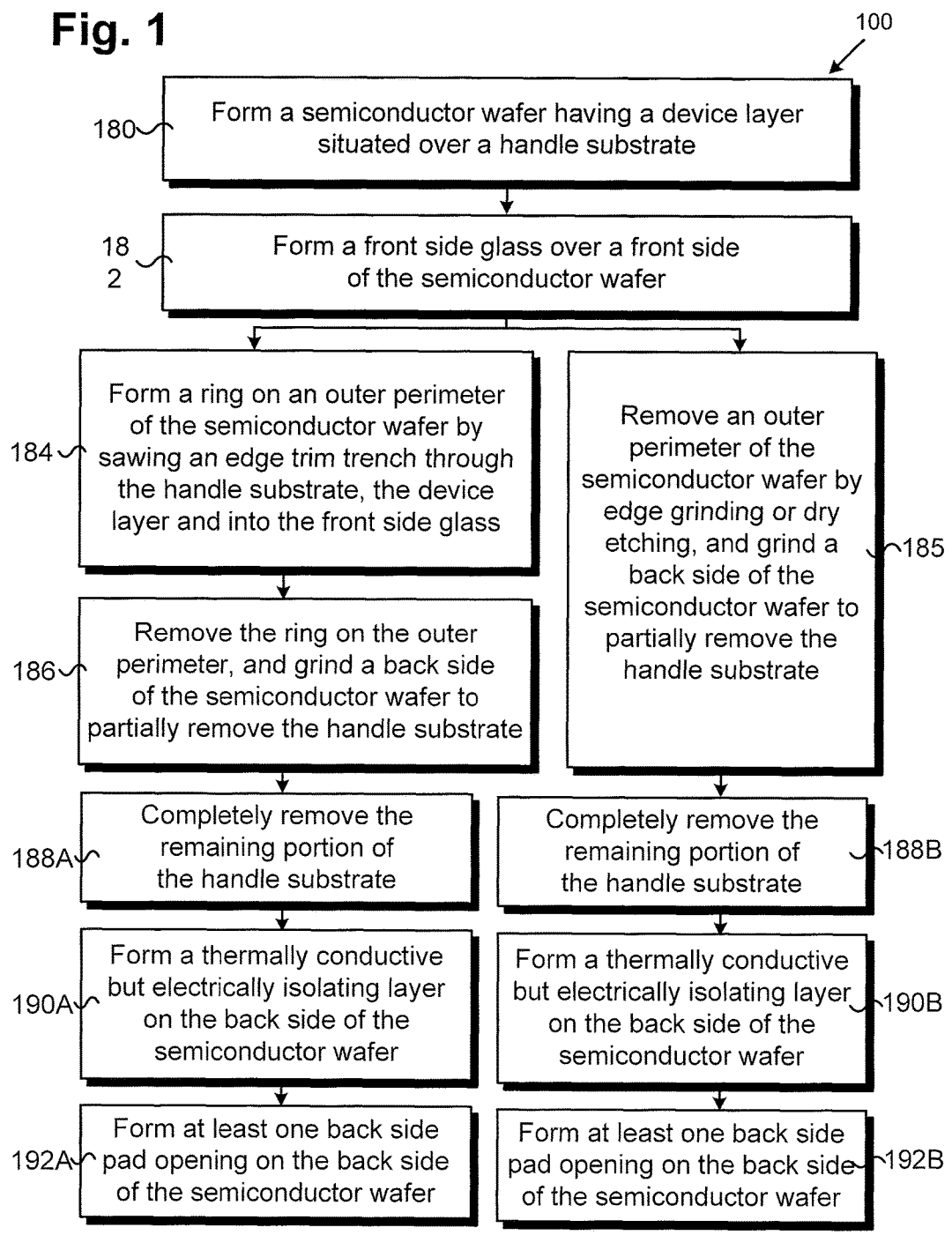

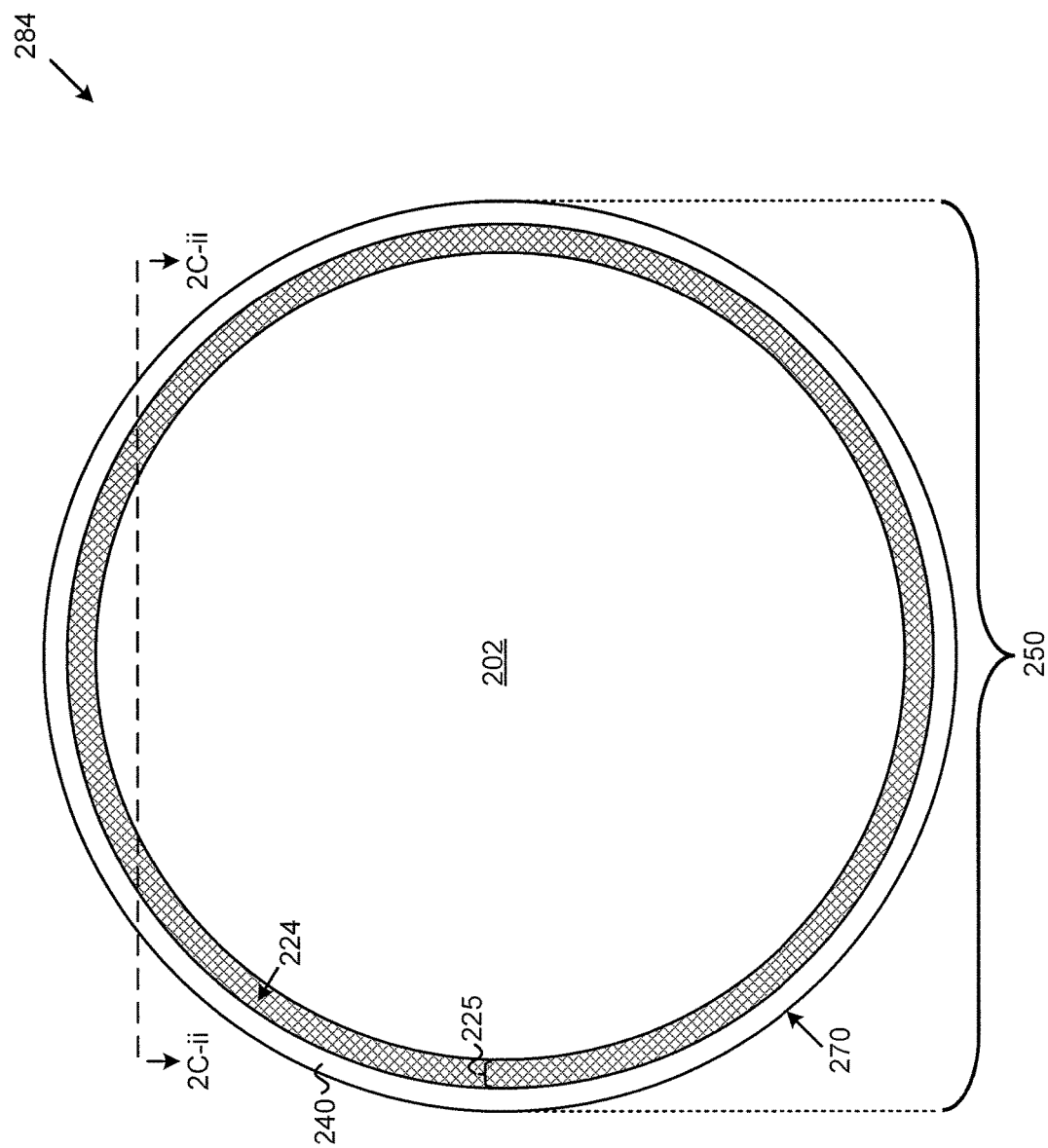
Fig. 2C-i

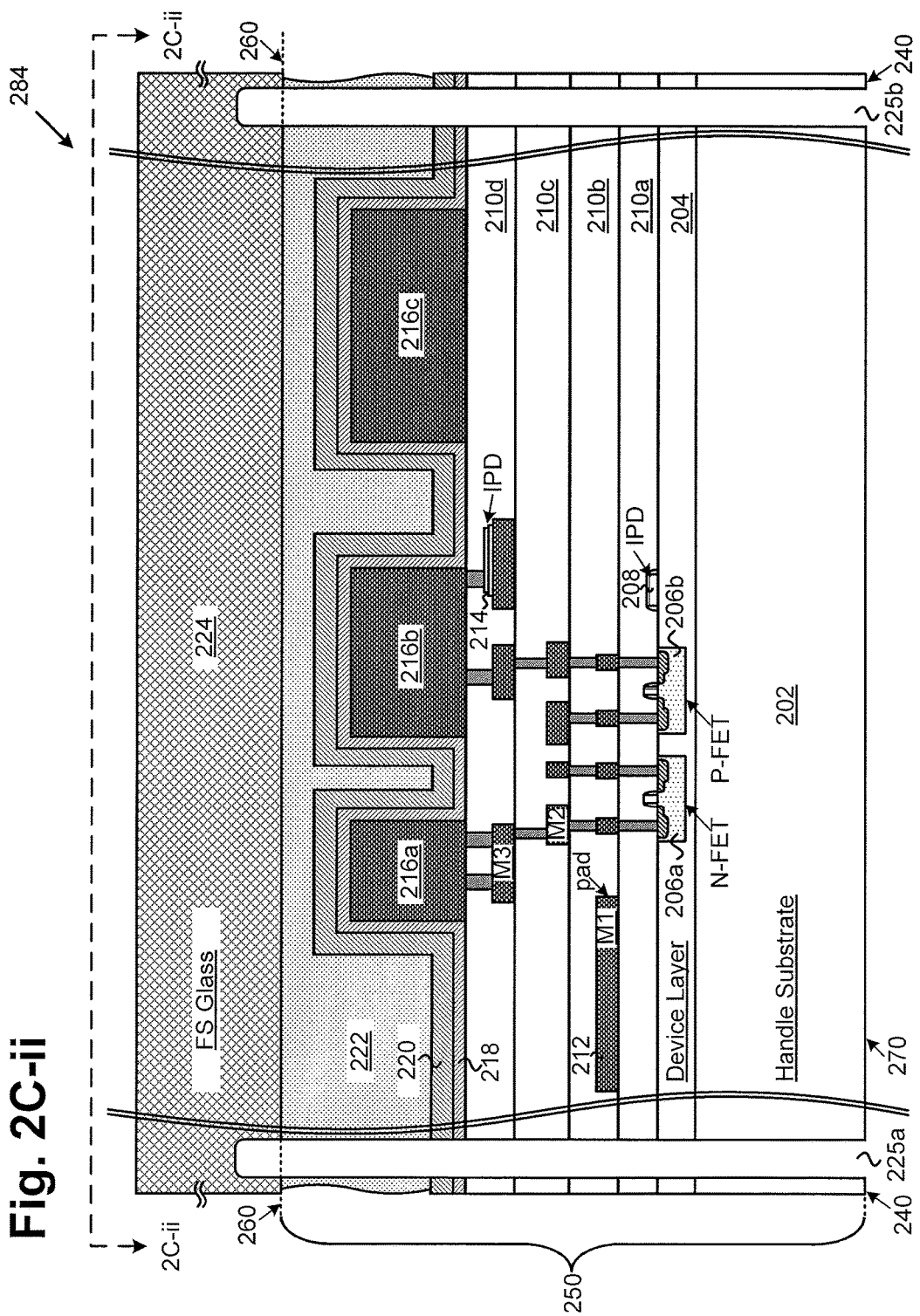
Fig. 2C-ii

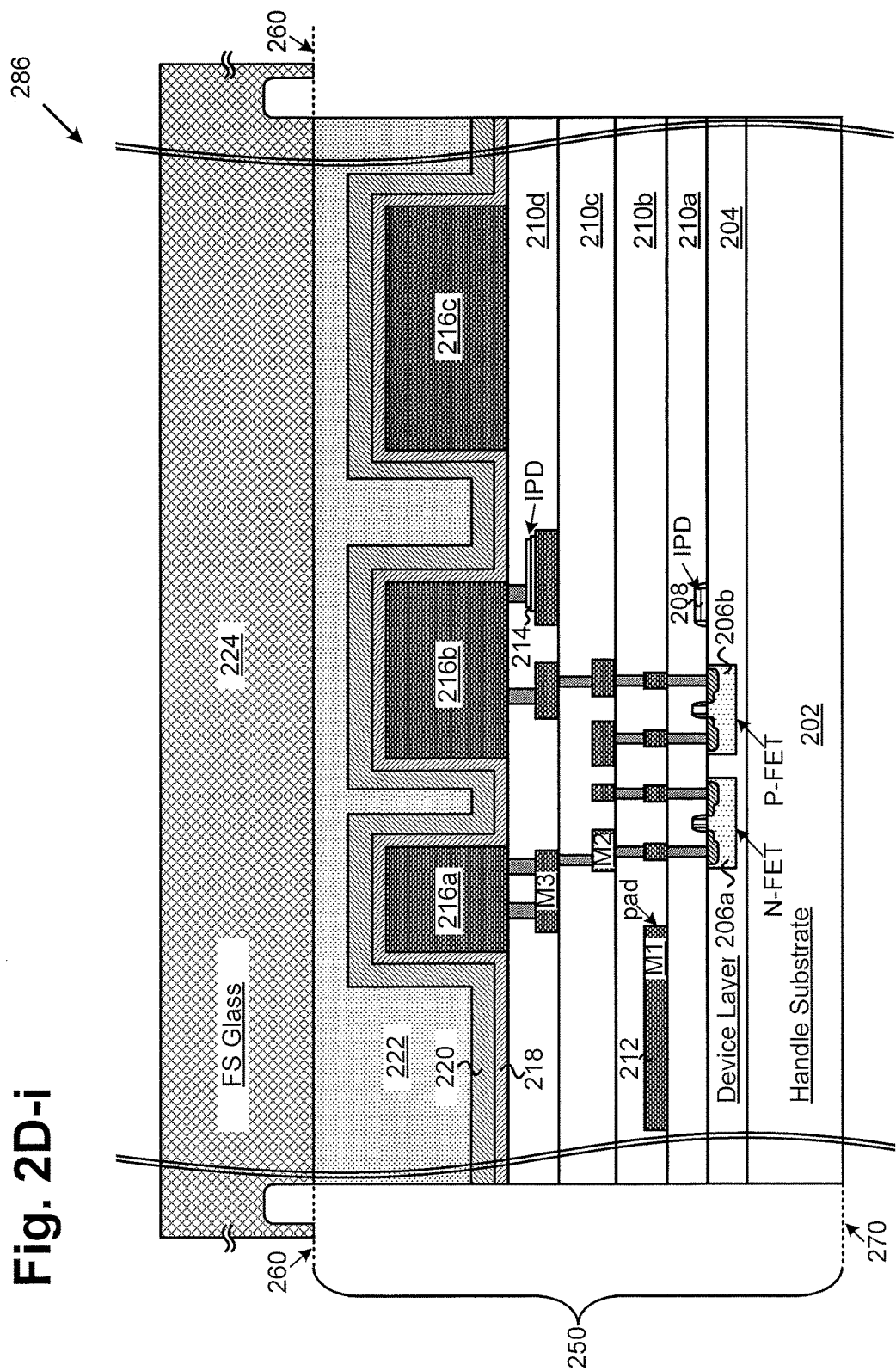
Fig. 2D-i

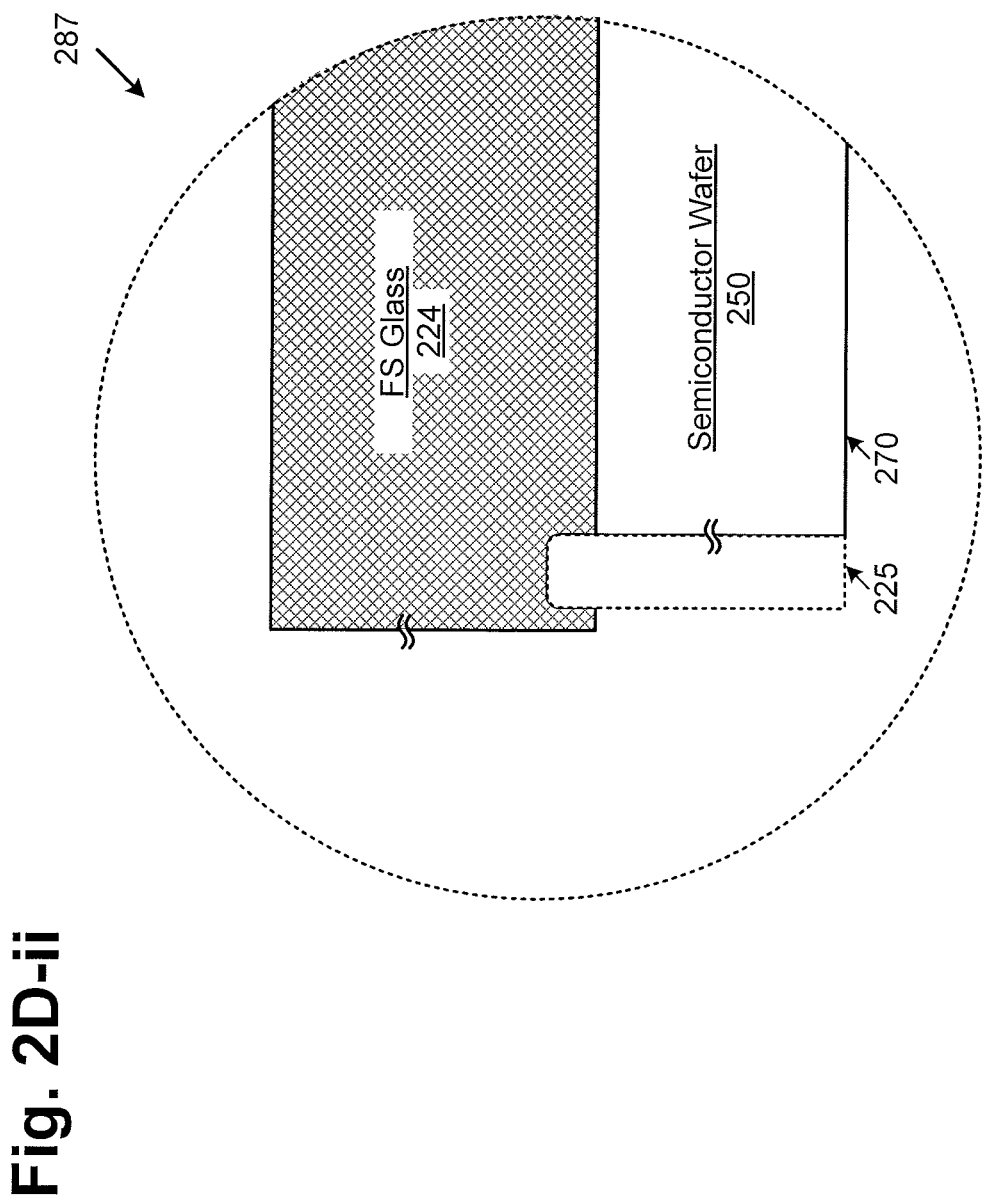
Fig. 2D-ii

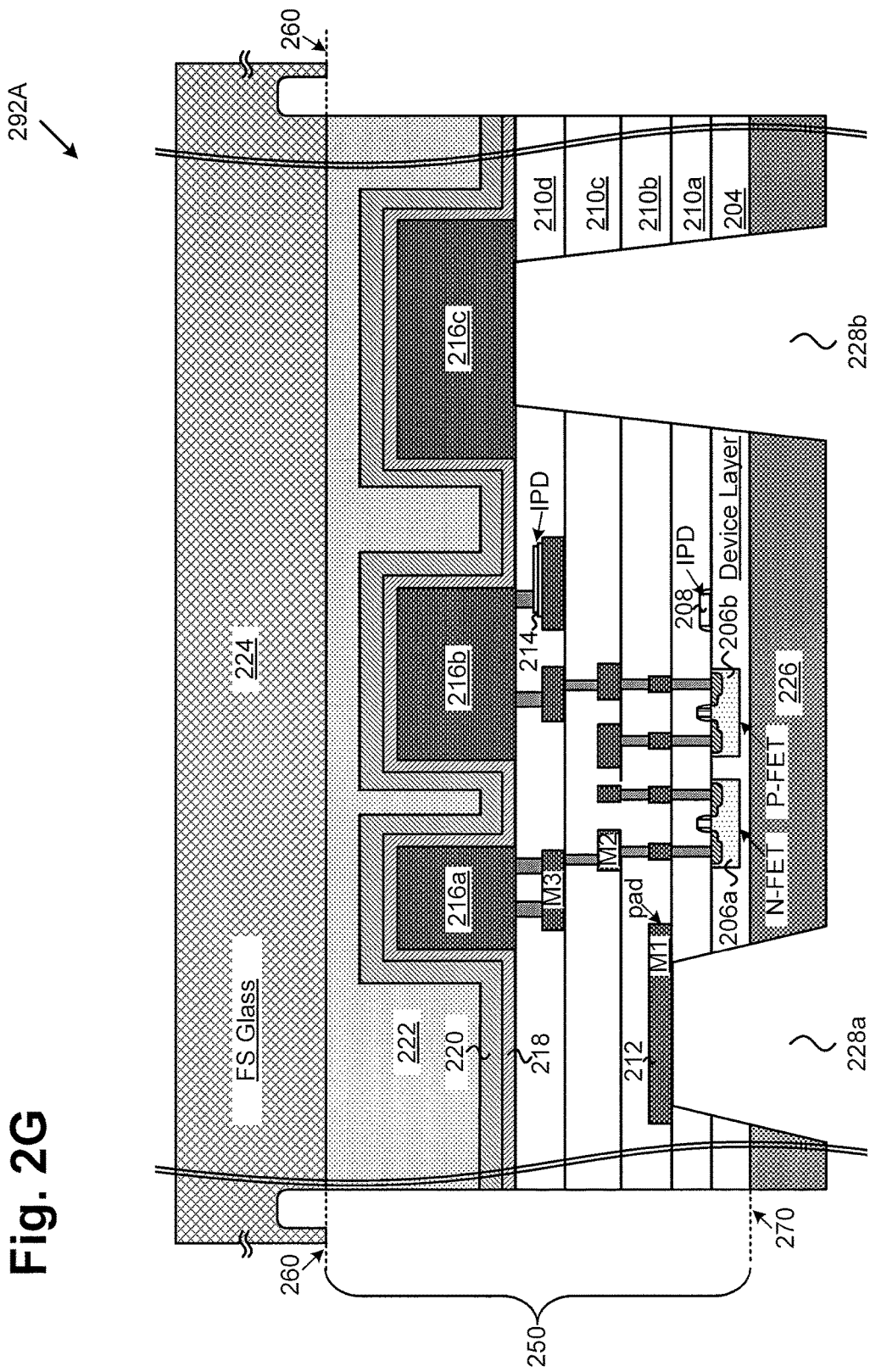

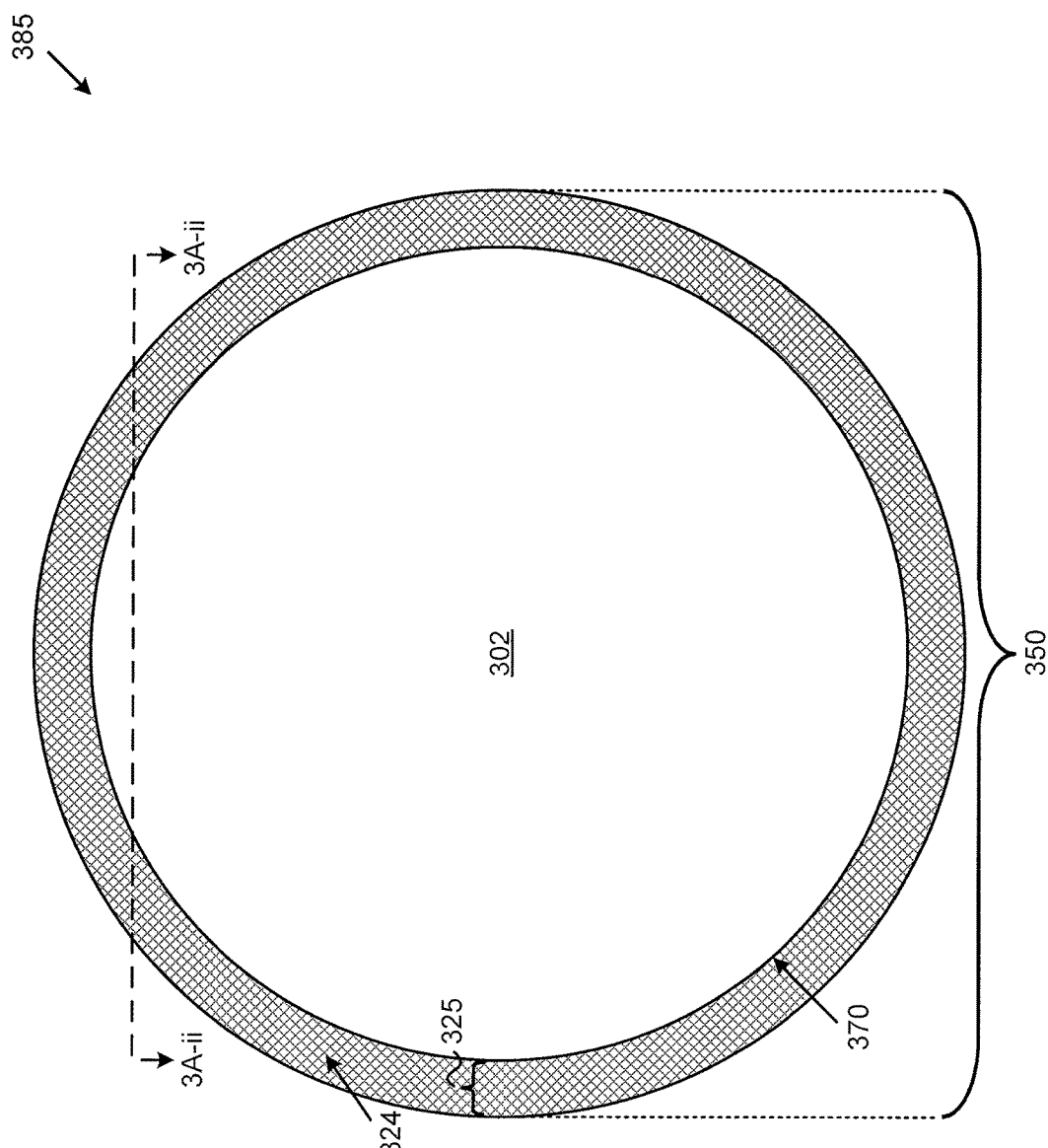
Fig. 3A-i

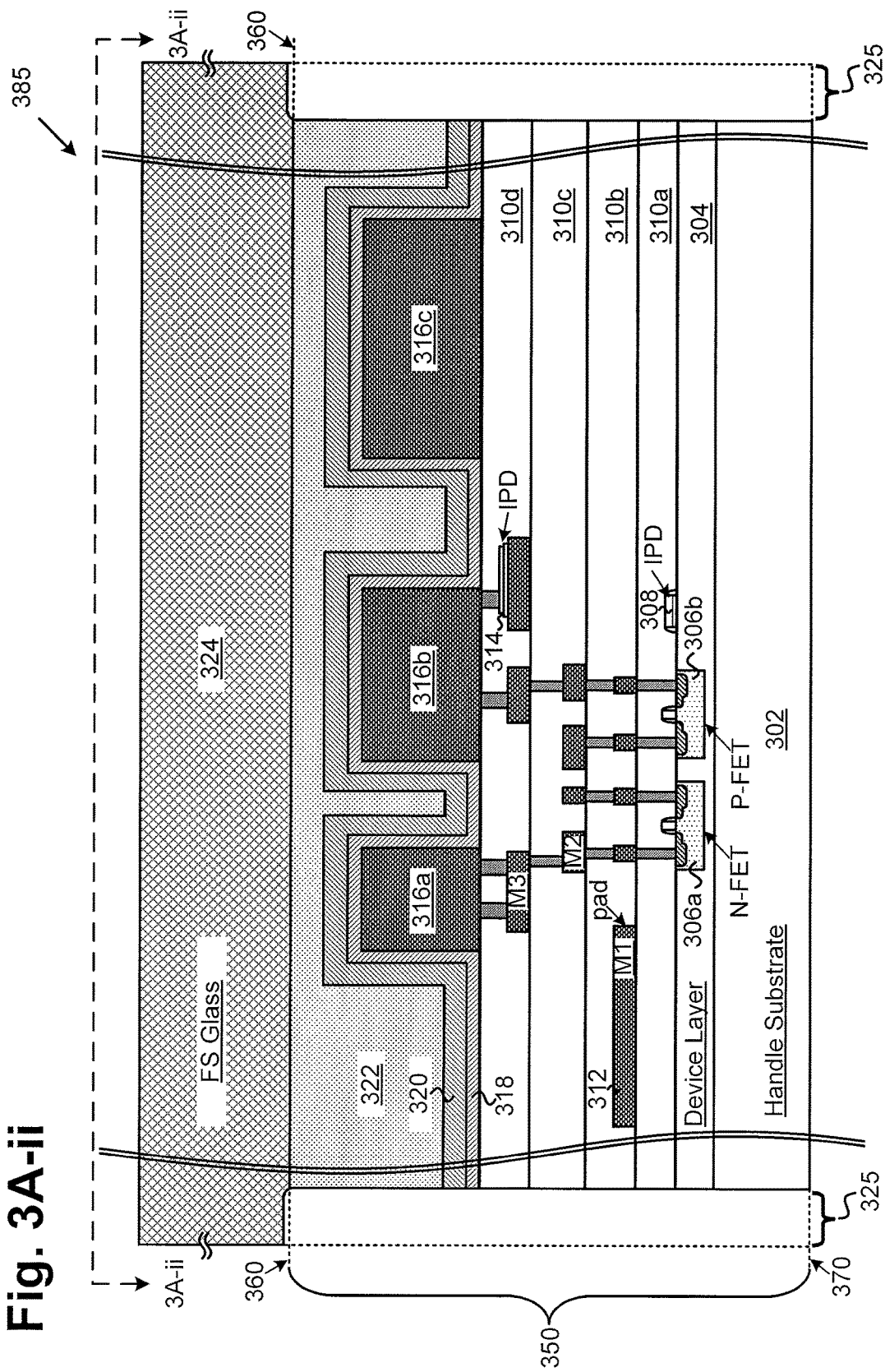
Fig. 3A-ii

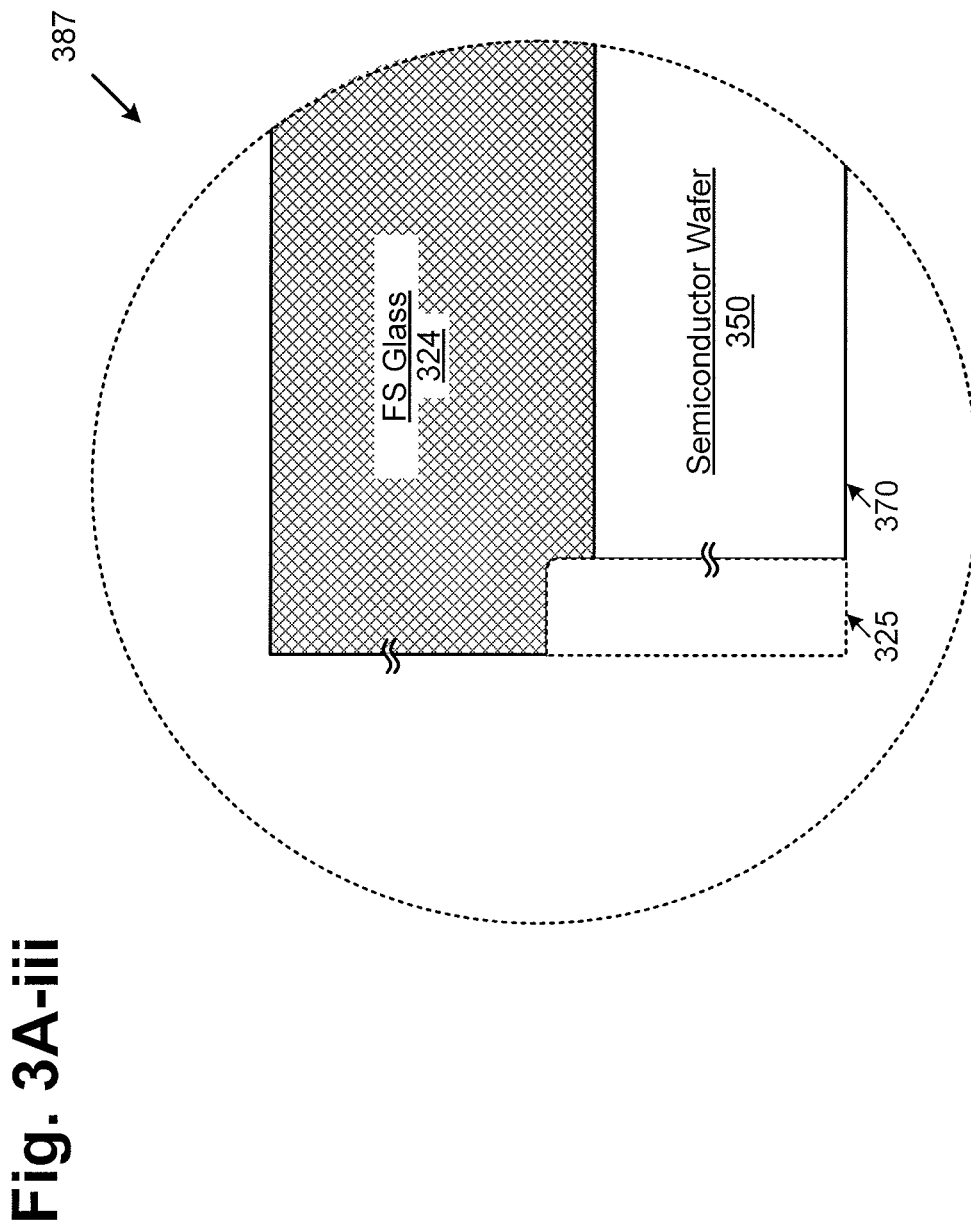
Fig. 3A-iii

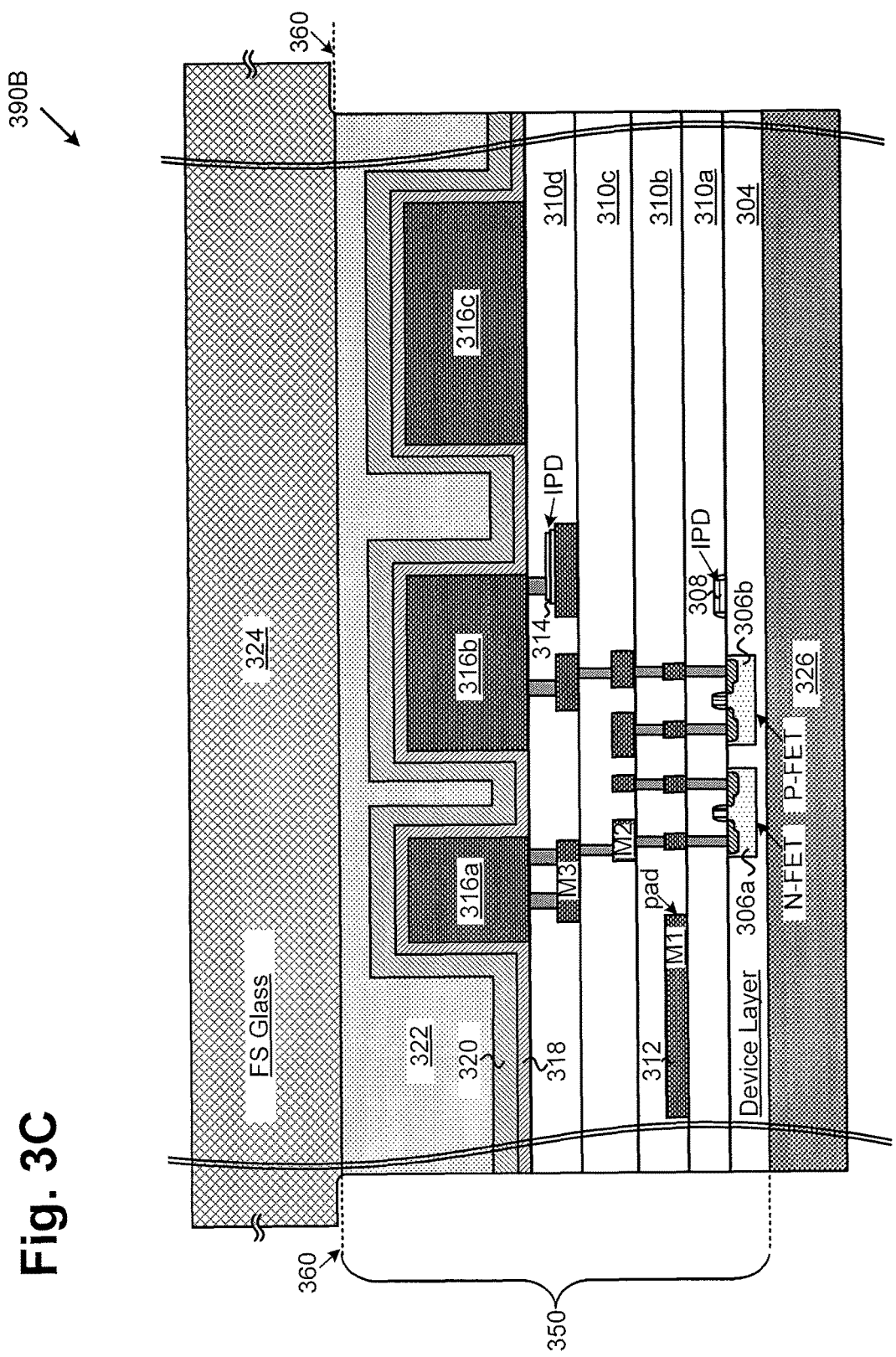

US 9,966,301 B2

REDUCED SUBSTRATE EFFECTS IN MONOLITHICALLY INTEGRATED RF CIRCUITS

BACKGROUND

The present application is related to, and hereby incorporates fully by reference the entire disclosure in U.S. patent application entitled "Integration of Thermally Conductive but Electrically Isolating Layers with Semiconductor Devices," naming as inventor David J. Howard, and filed on the same day as the present application on Jun. 27, 2016, and having U.S. patent Ser. No. 15/194,183.

In monolithic radio frequency ("RF") circuits, losses associated with the substrate impedance have deleterious effects on performance. For example, in RF switches built on bulk substrate technology with junction isolations, parasitic substrate impedance (e.g., capacitive coupling) can result in degraded linearity and voltage imbalance across large branches of stacked semiconductor devices. Other deleterious effects may include higher parasitic losses suffered by passive components (e.g., transmission lines, inductors, etc.) reflected in lower quality factor, and unwanted crosstalk between devices or circuit blocks through the substrate.

In monolithic RF circuits utilizing bulk substrate technology, propagation of signals in the substrate medium can introduce unwanted second and third harmonics, which can significantly degrade the linearity of the RF signals. Some of this degradation can be partially mitigated by using high resistivity substrates. In a conventional monolithic RF circuit employing a high resistivity substrate, fixed positive charges in the dielectric layers on top of the high resistivity substrate, can induce an inversion layer in the high resistivity substrate. For example, due to the low background doping of the high resistivity substrate, the fixed positive charges can cause an accumulation of high mobility carriers of opposite polarity under the dielectric layer. This inversion layer of high mobility carriers can significantly decrease the effective resistivity of the high resistivity substrate. In addition, the capacitive coupling between one or more of the metal layers and the high resistivity substrate can also become voltage dependent.

Accordingly, there is a need to overcome the drawbacks and deficiencies in the art by substantially eliminating substrate parasitics and improving RF signal linearity of monolithically integrated RF circuits.

SUMMARY

The present disclosure is directed to reduced substrate effects in monolithically integrated radio frequency ("RF") circuits, substantially as shown in and/or described in connection with at least one of the figures, and as set forth in the claims.

BRIEF DESCRIPTION OF THE DRAWINGS

FIG. 1 is a flowchart illustrating methods for fabricating exemplary structures for reducing substrate effects in monolithically integrated RF circuits through layer transfer to front side glass according to implementations of the present application.

FIG. 2C-i illustrates a top plan view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2C-ii illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2D-i illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2D-ii illustrates a cross-sectional schematic view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2E illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2F illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 2G illustrates a cross-sectional view of a portion of an exemplary structure for reducing substrate effects in monolithically integrated RF circuits through layer transfer to front side glass processed in accordance with a final action in the flowchart of FIG. 1 according to one implementation of the present application.

FIG. 3A-i illustrates a top plan view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 3A-ii illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 3A-iii illustrates a cross-sectional schematic view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 3B illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 3C illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

FIG. 3D illustrates a cross-sectional view of a portion of an exemplary structure for reducing substrate effects in monolithically integrated RF circuits through layer transfer to front side glass processed in accordance with a final action in the flowchart of FIG. 1 according to one implementation of the present application.

DETAILED DESCRIPTION

Figure 2A:
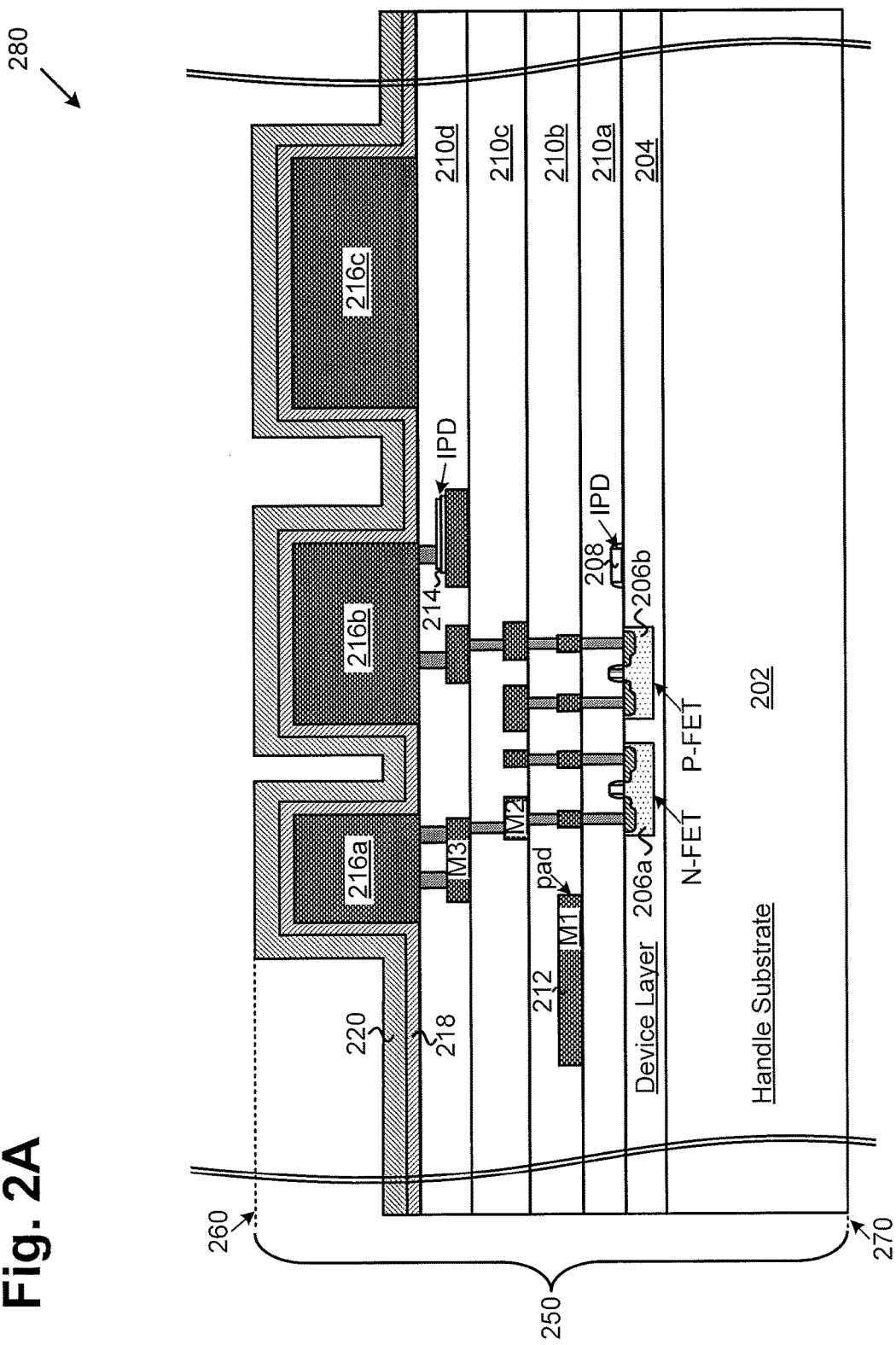
FIG. 2A illustrates a cross-sectional view of a portion of an exemplary structure for reducing substrate effects in monolithically integrated RF circuits through layer transfer to front side glass processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating exemplary methods for fabricating exemplary structures for reducing substrate effects in monolithically integrated RF circuits through layer transfer to front side glass according to implementations of the present application. Certain details and features have been left out of the flowchart that are apparent to a person of ordinary skill in the art. For example, an action may consist of one or more subactions or may involve specialized equipment or materials, as known in the art. In one implementation, actions 180, 182, 184, 186, 188A, 190A and 192A indicated in flowchart 100 are sufficient to describe one implementation of the present inventive concepts, other implementations of the present inventive concepts may utilize actions different from those shown in flowchart 100. Moreover, structures 280, 282, 284, 286, 288A, 290A and 292A in FIGS. 2A, 2B, 2C-i/2C-ii, 2D-i, 2E, 2F and 2G illustrate the results of performing actions 180, 182, 184, 186, 188A, 190A and 192A of flowchart 100, respectively. For example, structure 280 is a portion of an exemplary structure for reducing substrate effects in monolithically integrated RF circuits through layer transfer to front side glass after processing action 180, structure 282 is a portion of an exemplary structure for reducing substrate effects in monolithically integrated RF circuits through layer transfer to front side glass after the processing of action 182, structure 284 is a portion of an exemplary structure for reducing substrate effects in monolithically integrated RF circuits through layer transfer to front side glass after the processing of action 184, and so forth.

Referring to action 180 in FIG. 1 and structure 280 in FIG. 2A, action 180 includes forming a semiconductor wafer having a device layer situated over a handle substrate. Referring to FIG. 2A, structure 280 illustrates a cross-sectional view of a portion of an exemplary structure for reducing substrate effects in monolithically integrated RF circuits through layer transfer to front side glass after the processing of action 180 in flowchart 100 of FIG. 1, according to one implementation of the present application. As illustrated in FIG. 2A, structure 280 includes semiconductor wafer 250 having handle substrate 202, device layer 204, and dielectric layers 210a, 210b, 210c and 210d. Semiconductor wafer 250 also includes various patterned interconnect metal layers and conductive vias in dielectric layers 210a, 210b, 210c and 210d, and contact pads 216a, 216b and 216c for external connections. In the present implementation, semiconductor wafer 250 is a radio frequency (RF) complementary metal-oxide-semiconductor (CMOS) wafer. In other implementations, semiconductor wafer 250 may be any suitable semiconductor wafer.

As illustrated in FIG. 2A, handle substrate 202 is on back side 270 of semiconductor wafer 250. Handle substrate 202 may include any suitable material to support active and/or passive devices thereon. In one implementation, handle substrate 202 may be a semiconductor substrate, having silicon, silicon-on-insulator (SOI), silicon-on-sapphire (SOS), silicon germanium, an epitaxial layer of silicon formed on a silicon substrate, or the like. In another implementation, handle substrate 202 may be a high resistivity substrate.

As illustrated in FIG. 2A, device layer 204 is situated over handle substrate 202. In the present implementation, device layer 204 may include active circuits that can comprise any form of circuitry that switches from one state to another to perform logic functions (e.g., transistors) such as radio frequency (RF) circuits, power amplifier circuits, voltage control oscillator circuits, ring oscillator circuits, low noise amplifier circuits, mixer circuits, digital-to-analog converter circuits, and analog-to-digital converters circuits. In one implementation, device layer 204 includes semiconductor material, such as silicon or silicon germanium. As illustrated in FIG. 2A, device layer 204 includes N-channel field-effect transistor (NFET) 206a and P-channel field-effect transistor (PFET) 206b integrated therein. NFET 206a may be formed in a CMOS P well, and include source and drain regions and a gate structure formed over a channel region of NFET 206a. PFET 206b may be formed in a CMOS N well, and include source and drain regions and a gate structure formed over a channel region of PFET 206b. It should be noted that, although only NFET 206a and PFET 206b are shown in FIG. 2A, there can be other active devices, such as complementary-metal-oxide-semiconductor (CMOS) devices, bipolar complementary-metal-oxide-semiconductor (BiCMOS) devices and/or power amplifiers, integrated in device layer 204. As illustrated in FIG. 2A, integrated passive device (IPD) 208 is formed on device layer 204. IPD 208 may include a resistor, a capacitor, an inductor, a coupler, a transformer, an antenna, a microelectromechanical systems (MEMS) device, or a phase change device (e.g., phase change memory device). It should be noted that, although only IPD 208 is shown in FIG. 2A, there can be other integrated passive devices on device layer 204.

As illustrated in FIG. 2A, dielectric layers 210a, 210b, 210c and 210d are formed over device layer 204. Dielectric layers 210a, 210b, 210c and 210d may include any suitable dielectric material, such as silicon dioxide. Interconnect metal layers M1, M2 and M3 are formed and patterned on dielectric layers 210a, 210b and 210c, respectively. As illustrated in FIG. 2A, patterned interconnect metal layers along with conductive vias are configured to provide electrical connections to one or more devices, such as NFET 206a and PFET 206b in device layer 204. In addition, contact pad 212 as a part of patterned interconnect metal layer M1 is formed on dielectric layer 210a, and configured to provide electrical connection for one or more devices integrated in semiconductor wafer 250.

As illustrated in FIG. 2A, NFET 206a is electrically coupled to contact pad 216a situated over dielectric layer 210d through corresponding patterned interconnect metal layers M1, M2 and M3, and conductive vias. Similarly, PFET 206b is electrically coupled to contact pad 216b situated over dielectric layer 210d through corresponding patterned interconnect metal layers M1, M2 and M3, and conductive vias. Also, integrated passive device (IPD) 214 is formed on dielectric layer 210c and coupled to contact pad 216b through one or more conductive vias, for example. IPD 214 may include a passive device such as a resistor, a capacitor, an inductor, a coupler, a transformer, an antenna, a microelectromechanical systems (MEMS) device, or a phase change device (e.g., phase change memory device). Contact pad 216c is situated over dielectric layer 210d, and electrically coupled to one or more semiconductor devices (not explicitly shown in FIG. 2A) integrated in semiconductor wafer 250. Patterned interconnect metal layers M1, M2 and M3, conductive vias, and contact pads 216a, 216b and 216c may each include any suitable conductive material, such as a metal or a metal alloy. As illustrated in FIG. 2A, front side 260 of semiconductor wafer 250 is covered with passivation layers 218 and 220. In one implementation, passivation layers 218 and 220 may include an oxide-based material and a nitride-based material, respectively. It should be understood that, in the present implementation, NFET 206a, PFET 206b, IPD 208, contact pad 212, IPD 214 and contact pads 216a, 216b and 216c, may be situated in the center portion of semiconductor wafer 250 and spaced relatively far away from the outer edge of semiconductor wafer 250, as indicated by the double squiggle lines on both sides of semiconductor wafer 250 in FIG. 2A.

Figure 2B:
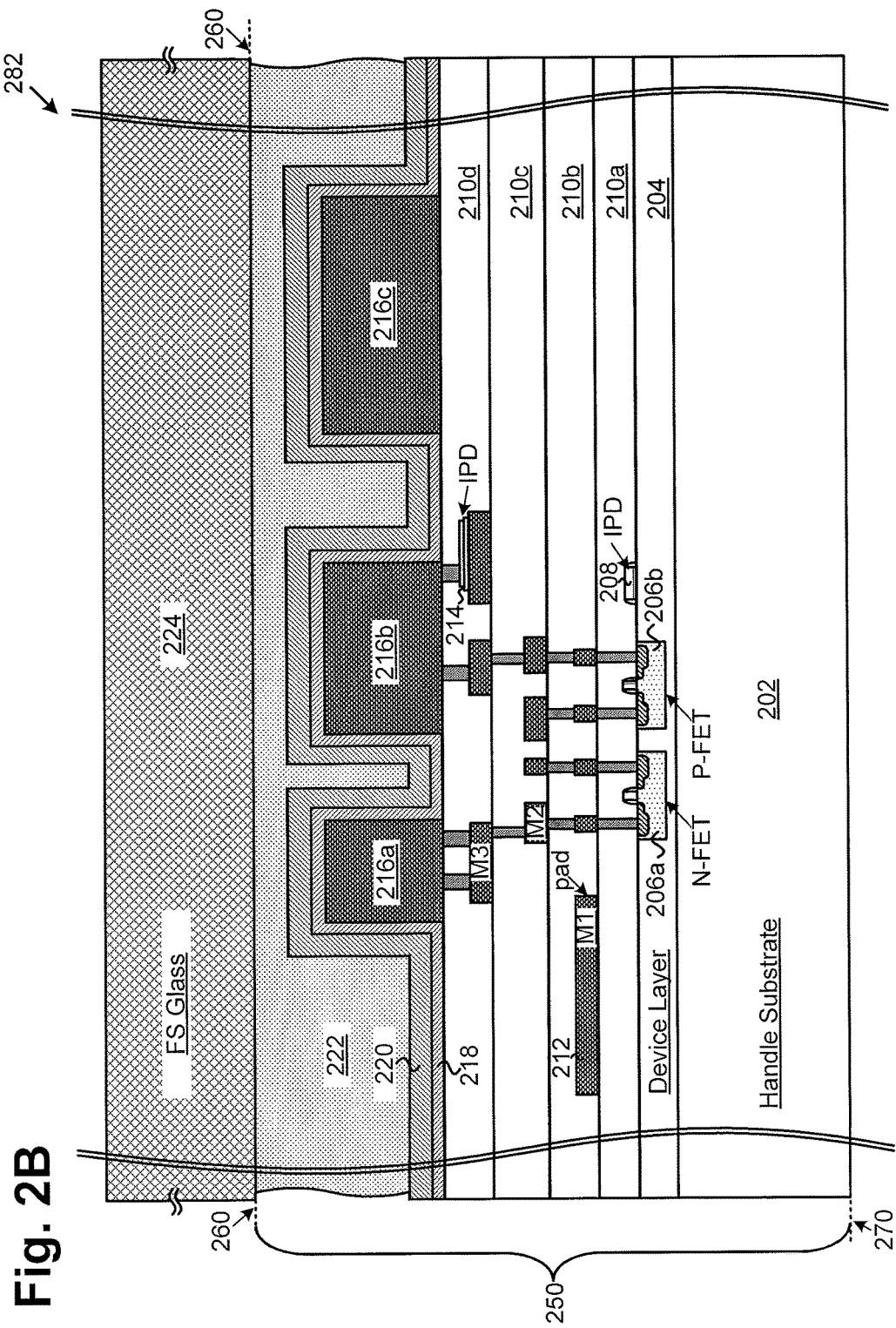
FIG. 2B illustrates a cross-sectional view of a portion of an exemplary structure for reducing substrate effects in monolithically integrated RF circuits through layer transfer to front side glass processed in accordance with an intermediate action in the flowchart of FIG. 1 according to one implementation of the present application.

Referring to action 182 in FIG. 1 and structure 282 in FIG. 2B, action 182 includes forming a front side glass over a front side of the semiconductor wafer. Referring to FIG. 2B, structure 282 illustrates a cross-sectional view of a portion of an exemplary structure for reducing substrate effects in monolithically integrated RF circuits through layer transfer to front side glass after the processing of action 182 in flowchart 100 of FIG. 1, according to one implementation of the present application. As illustrated in FIG. 2B, structure 282 includes front side glass 224 over front side 260 of semiconductor wafer 250.

As illustrated in FIG. 2B, front side glass 224 is situated over front side 260 of semiconductor wafer 250. Oxide layer 222 is deposited and optionally planarized over front side 260 of semiconductor wafer 250 before front side glass 224 is formed thereon. In one implementation, front side glass 224 may be coupled to front side 260 of semiconductor wafer 250 by, for example, fusion bonding. In another implementation, front side glass 224 may be coupled to front side 260 of semiconductor wafer 250 by polymer bonding, for example, using benzocyclobutene or polyimide. Front side glass 224 may include any suitable low contaminant glass, such as low sodium glass. Suitable low contaminant glasses may include, but are not limited to, semiconductor wafer glass (e.g., commercially available Corning® Semiconductor Glass Wafers), silicon oxide glass, and aluminum oxide glass.

In the present implementation, front side glass 224 is coupled to oxide layer 222 by oxide fusion bonding followed by a low temperature anneal (e.g., 150° C. to 200° C.) to reinforce the fusion bonds. As can be seen in FIG. 2B, oxide layer 222 between front side glass 224 and front side 260 of semiconductor wafer 250 is not uniform around the outer perimeter of semiconductor wafer 250. As a result, portions of front side glass 224 are not supported by oxide layer 222, which may result in stress in structure 282 and can lead to cracking of semiconductor wafer 250 and/or front side glass 224. Thus, it is desirable to remove the outer perimeter of structure 282.

Referring to action 184 in FIG. 1 and structure 284 in FIGS. 2C-i and 2C-ii, action 184 includes forming a ring on an outer perimeter of the semiconductor wafer by sawing an edge trim trench through the handle substrate, the device layer and into the front side glass. The result of action 184 is illustrated by reference to FIGS. 2C-i and 2C-ii. FIG. 2C-i illustrates a top plan view of a back side of an exemplary structure for reducing substrate effects in monolithically integrated RF circuits through layer transfer to front side glass after the processing of action 184 in flowchart 100 of FIG. 1, according to one implementation of the present application. FIG. 2C-ii illustrates a cross-sectional view of a portion of an exemplary structure for reducing substrate effects in monolithically integrated RF circuits through layer transfer to front side glass after the processing of action 184 in flowchart 100 of FIG. 1, according to one implementation of the present application.

FIG. 2C-i illustrates a top plan view of the back side of structure 284. As illustrated in FIG. 2C-i, structure 284 includes handle substrate 202 of semiconductor wafer 250, edge trim trench 225 on back side 270 of semiconductor wafer 250, and ring 240 on the outer perimeter of semiconductor wafer 250. As can be seen in FIG. 2C-i, edge trim trench 225 extends through handle substrate 202, device layer 204 (as shown in FIG. 2C-ii) and into front side glass 224.

FIG. 2C-ii illustrates an exemplary cross-sectional view of structure 284 along line 2C-ii in FIG. 2C-i after completion of action 184 in flowchart 100 of FIG. 1. As illustrated in FIG. 2C-ii, edge trim trench 225 (shown as edge trim trenches 225a and 225b on both sides of the cross-sectional view of edge trim trench 225) extends through handle substrate 202, device layer 204, dielectric layers 210a, 210b, 210c and 210d, passivation layers 218 and 220, oxide layer 222, and into front side glass 224. Edge trim trench 225 can be formed by any suitable method, such as sawing or dicing. As a result of forming edge trim trench 225, ring 240 is formed on the outer perimeter of structure 284, where the uneven portion of oxide layer 222 on the outer perimeter of structure 284 is isolated from the center portion of structure 284. It should be noted that edge trim trench 225 is on the outer perimeter of semiconductor wafer 250, and spaced relatively far away from NFET 206a, PFET 206b, IPD 208, contact pad 212, IPD 214 and contact pads 216a, 216b and 216c, as indicated by the double squiggle lines on both sides of semiconductor wafer 250. As such, NFET 206a, PFET 206b, IPD 208, contact pad 212, IPD 214 and contact pads 216a, 216b and 216c within the enclosure formed by edge trim trench 225 remain unaffected by the formation of ring 240.

Referring to action 186 in FIG. 1 and structure 286 in FIG. 2D-i, action 186 includes removing the ring on the outer perimeter of the semiconductor wafer, and grinding a back side of the semiconductor wafer to partially remove the handle substrate. Referring to FIG. 2D-i, structure 286 illustrates a cross-sectional view of a portion of an exemplary structure for reducing substrate effects in monolithically integrated RF circuits through layer transfer to front side glass after the processing of action 186 in flowchart 100 of FIG. 1, according to one implementation of the present application. As illustrated in FIG. 2D-i, ring 240 as shown in FIG. 2C-ii is removed from structure 286. Also, handle substrate 202 is partially removed from back side 270 of semiconductor wafer 250. It should be noted that ring 240 and handle substrate 202 may each be removed by any suitable method. In one implementation, ring 240 may be removed by, for example, edge grinding or trimming. In one implementation, handle substrate 202 may be partially removed by, for example, back side grinding.

FIG. 2D-ii illustrates a cross-sectional schematic view of a portion of an exemplary structure for reducing substrate effects in monolithically integrated RF circuits through layer transfer to front side glass processed in accordance with an intermediate action in the flowchart of FIG. 1 according to one implementation of the present application. As illustrated in FIG. 2D-ii, structure 287 shows the edge profile of edge trim trench 225 extending from back side 270 of semiconductor wafer 250 to front side glass 224. The edge profile is configured to decrease the chance of edge cracking and/or bending, and improve mechanical integrity and flatness of structure 287.

Figure 2E:
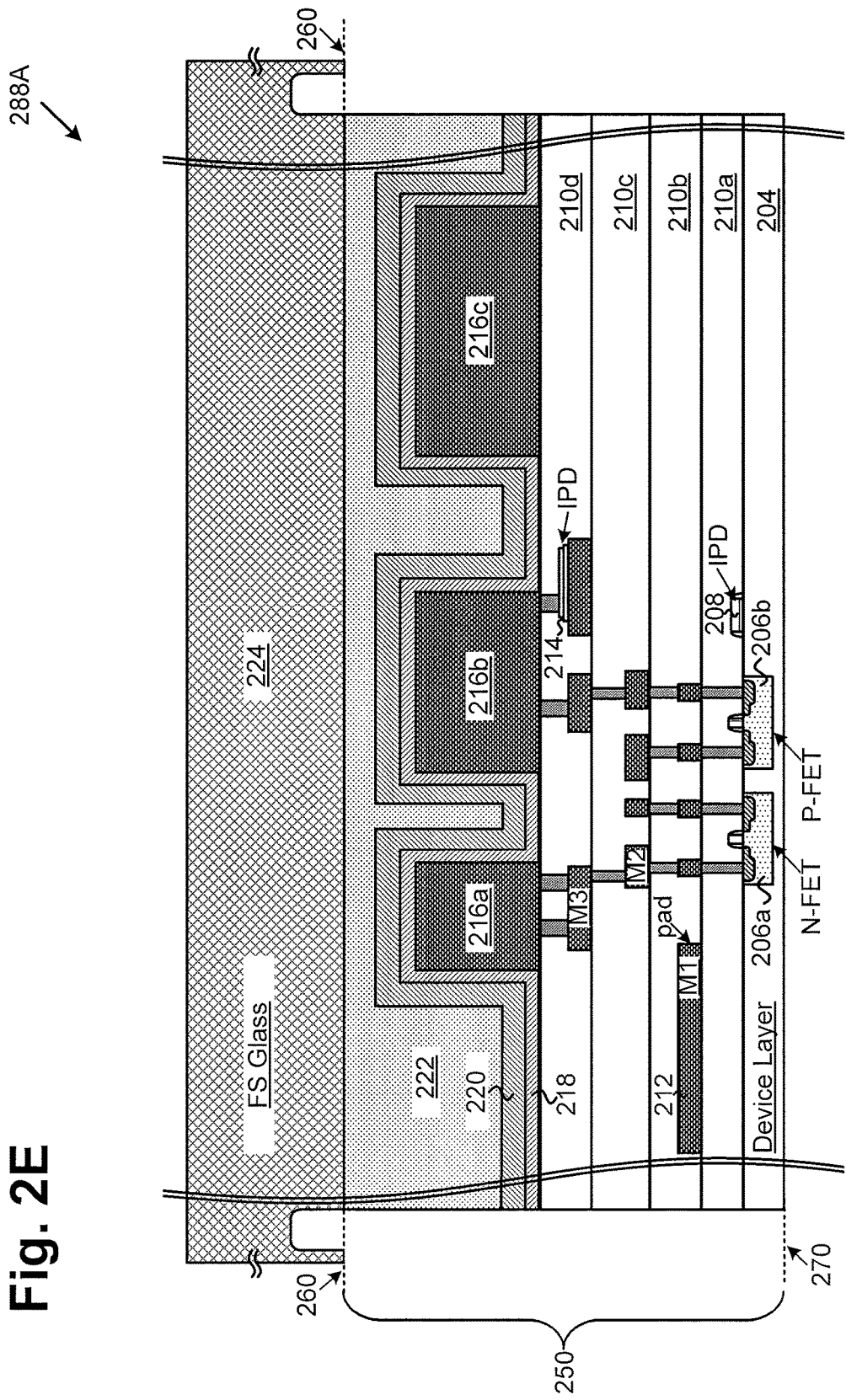

Referring to action 188A in FIG. 1 and structure 288A in FIG. 2E, action 188A includes completely removing the remaining portion of the handle substrate. Referring to FIG. 2E, structure 288A illustrates a cross-sectional view of a portion of an exemplary structure for reducing substrate effects in monolithically integrated RF circuits through layer transfer to front side glass after the processing of action 188A in flowchart 100 of FIG. 1, according to one implementation of the present application. As illustrated in FIG. 2E, the remaining portion of handle substrate 202 as shown in FIG. 2D is removed from structure 288A, for example, by etching.

The removal of the remaining portion of handle substrate 202 may include one or more etching processes using one or more etchants. For example, one or more removal agents may be applied to etch away the remaining portion of handle substrate 202 by wet or dry isotropic etching. In one implementation, an isotropic plasma or vapor may be used to etch away the semiconductor material in the remaining portion of handle substrate 202. In another implementation, in case where the remaining portion of handle substrate 202 includes an inorganic oxide, such as silicon dioxide ($SiO_2$), a fluoride based etchant, such as a hydrofluoric acid vapor ("HF") etchant can be used to remove the oxide material. In yet another implementation, in case where the remaining portion of handle substrate 202 includes a silicon-based material, such as amorphous silicon, a fluorine-based material, such as $NF_3$, can be used to remove the silicon-based material. It should be understood that the removal of the remaining portion of handle substrate 202 can be accomplished by other suitable methods, such as grinding, lapping, polishing, etching or any combination thereof.

After removing the remaining portion of handle substrate 202, device layer 204 is exposed from back side 270 of semiconductor wafer 250. By removing handle substrate 202, parasitic charges, which would otherwise be present in handle substrate 202 and would in turn lead to a parasitic conduction layer, are effectively eliminated. For example, parasitic charge accumulation in handle substrate 202, for example, at an interface between a silicon substrate and an overlying isolating layer, can be effectively eliminated. Consequently, a parasitic coupling between a parasitic conduction layer (PCL) and overlying conductors can also be eliminated, thereby significantly reducing power loss and improving linearity (e.g., substantially eliminating second and third harmonics) of the RF signals in semiconductor wafer 250.

Figure 2F:
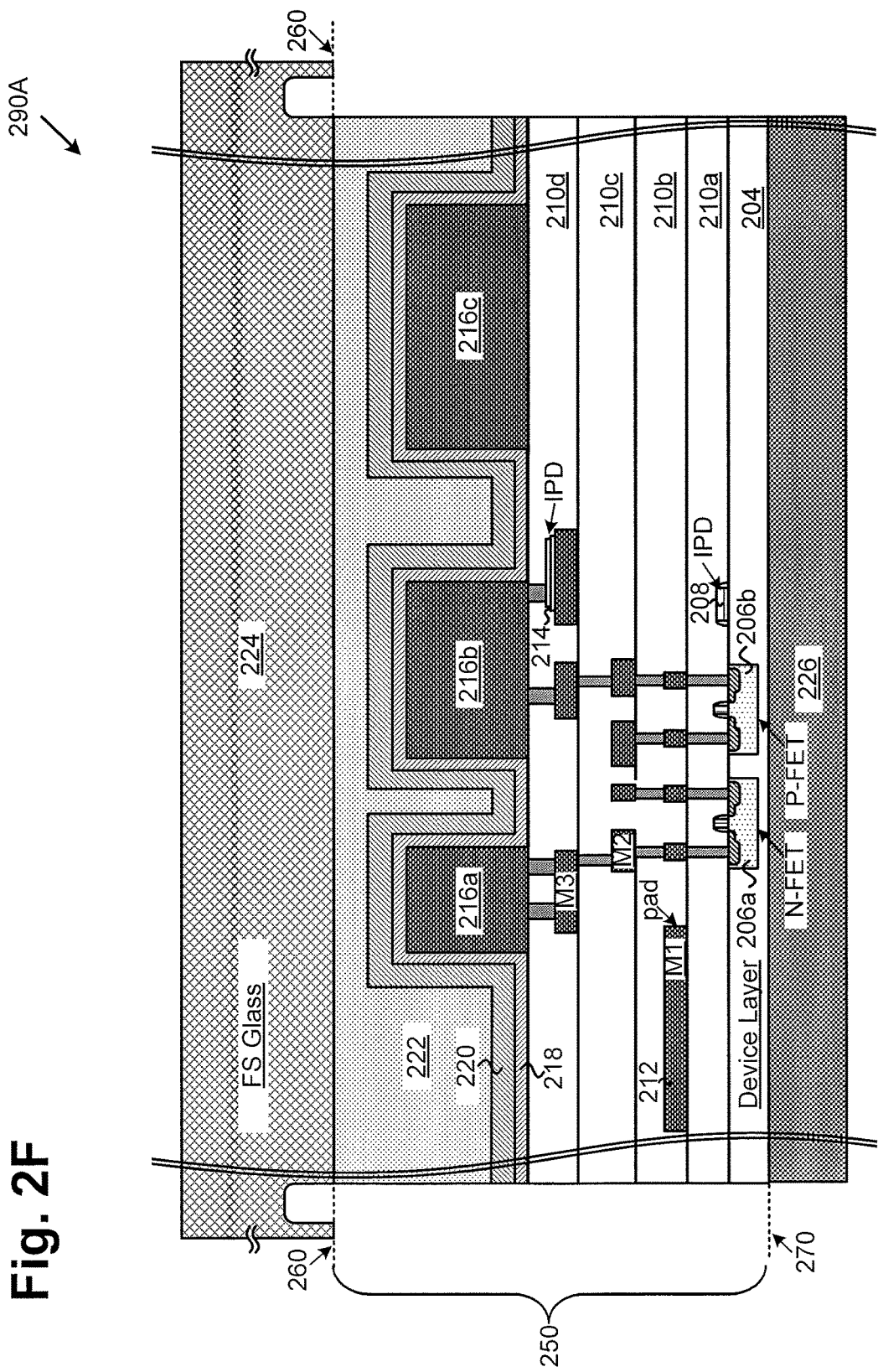

Referring to action 190A in FIG. 1 and structure 290A in FIG. 2F, action 190A includes forming a thermally conductive but electrically isolating layer on the back side of the semiconductor wafer. Referring to FIG. 2F, structure 290A illustrates a cross-sectional view of a portion of an exemplary structure for reducing substrate effects in monolithically integrated RF circuits through layer transfer to front side glass after the processing of action 190A in flowchart 100 of FIG. 1, according to one implementation of the present application. As illustrated in FIG. 2F, structure 290A includes thermally conductive but electrically isolating layer 226 on back side 270 of semiconductor wafer 250.

In the present implementation, thermally conductive but electrically isolating layer 226 includes a material with a high thermal conductivity (e.g., at least 36 W/mK) and a high resistivity (e.g., at least $10^{14}$ ohm-cm). In addition, thermally conductive but electrically isolating layer 226 has a coefficient of thermal expansion (CTE) that is closely matched (e.g., within the same order of magnitude) with device layer 204 to reduce mechanical and thermal stresses. In the present implementation, thermally conductive but electrically isolating layer 226 includes aluminum nitride (AlN). For example, aluminum nitride has a high thermal conductivity in a range approximately between 170-200 W/mK, a high resistivity of at least $10^{14}$ ohm-cm, and a CTE of approximately 4.6 ppm/C which is closely matched with the CTE of device layer 204 (e.g., silicon around 2.3-3.6 ppm/C). In another implementation, thermally conductive but electrically isolating layer 226 may include beryllium oxide having a high thermal conductivity of approximately 260 W/mK, a high resistivity of at least $10^{14}$ ohm-cm, and a CTE of approximately 8.5 ppm/C which is closely matched with the CTE of device layer 204. In yet another implementation, thermally conductive but electrically isolating layer 226 may include aluminum oxide having a high thermal conductivity of approximately 36 W/mK, a high resistivity of at least $10^{14}$ ohm-cm, and a CTE of approximately 8.2 ppm/C which is closely matched with the CTE of device layer 204.

In one implementation, action 190A may be accomplished using any appropriate deposition technique, such as chemical vapor deposition (CVD), physical vapor deposition (PVD) or atomic layer deposition (ALD) for example. In one implementation, thermally conductive but electrically isolating layer 226 may have a thickness in a range approximately between 0.5-2 microns (i.e., $10^{-6}$ meters). In one implementation, thermally conductive but electrically isolating layer 226 is formed preferably at low temperate (e.g., less than 450° C.) to prevent damage to semiconductor devices and interconnect metal layers in semiconductor wafer 250. It should be noted that the thermal conductivity, the resistivity, the CTE and the thickness of thermally conductive but electrically isolating layer 226 are not limited by the specified values or ranges mentioned above.

In the present implementation, since thermally conductive but electrically isolating layer 226 has a high thermal conductivity, it is configured to dissipate heat from semiconductor devices integrated in semiconductor wafer 250. For example, thermally conductive but electrically isolating layer 226 is thermally coupled to semiconductor devices, such as NFET 206a and NFET 206b, integrated in device layer 204. Thermally conductive but electrically isolating layer 226 is configured to draw the generated heat away from semiconductor wafer 250 not only in a direction perpendicular to back side 270 of semiconductor wafer 250, but more importantly in directions parallel to back side 270 of semiconductor wafer 250. Since heat generated by semiconductor devices, such as NFET 206a and PFET 206b, can be effectively drawn out of semiconductor wafer 250 through thermally conductive but electrically isolating layer 226, the semiconductor devices integrated in device layer 204 can be fabricated much closer to one another, at cell pitches less than the conventionally predetermined minimum cell pitch for preventing overheating. Thus, semiconductor wafer 250 can have an increased cell density, which can in turn lead to better device performance characteristics, such as a higher current carrying capability and lower $R_{DSON}$.

Moreover, by replacing handle substrate 202 with thermally conductive but electrically isolating layer 226 on back side 270 of semiconductor wafer 250, the present implementation can effectively eliminate parasitic effects, such as parasitic capacitance between a parasitic conduction layer (PCL) in handle substrate 202 and overlying conductors in semiconductor wafer 250. Thus, among other advantages, the present implementation can reduce power loss and improve linearity (e.g., substantially eliminating second and third harmonics) of the RF signals in semiconductor wafer 250. It should be noted that, in one implementation, the formation of thermally conductive but electrically isolating layer 226 on back side 270 of semiconductor wafer 250 may be optional, in which case back side 270 of semiconductor wafer 250 may be covered by one or more passivation layers (not explicitly shown in FIG. 2F).

Referring to action 192A in FIG. 1 and structure 292A in FIG. 2G, action 192A includes forming at least one back side pad opening on the back side of the semiconductor wafer. Referring to FIG. 2G, structure 292A illustrates a cross-sectional view of a portion of an exemplary structure for reducing substrate effects in monolithically integrated RF circuits through layer transfer to front side glass after the processing of action 192A in flowchart 100 of FIG. 1, according to one implementation of the present application. As illustrated in FIG. 2G, structure 292A includes back side pad openings 228a and 228b on back side 270 of semiconductor wafer 250.

As illustrated in FIG. 2G, back side pad opening 228a extends through thermally conductive but electrically isolating layer 226, device layer 204 and dielectric layer 210a from back side 270 of semiconductor wafer 250, and reaches contact pad 212. Back side pad opening 228a allows external connection to contact pad 212. Back side pad opening 228b extends through thermally conductive but electrically isolating layer 226, device layer 204 and dielectric layers 210a, 210b, 210c and 210d from back side 270 of semiconductor wafer 250, and reaches contact pad 216c. Back side pad opening 228b allows external connection to contact pad 216c. Back side pad openings 228a and 228b may be formed by any suitable method, such as a patterned etch. It should be understood that, although only two back side pad openings are shown in FIG. 2G, other back side pad openings (not explicitly shown in FIG. 2G) can be formed on back side 270 of semiconductor wafer 250 to reach other contact pads (not explicitly shown in FIG. 2G) in semiconductor wafer 250.

In one implementation, semiconductor structure 292A can be flip-chip mounted, with back side 270 of semiconductor wafer 250 facing down, to a printed circuit board (not explicitly shown in FIG. 2G) through conductive adhesives. In another implementation, front side glass 224 of semiconductor structure 292A can be attached to a printed circuit board (not explicitly shown in FIG. 2G), where contact pads 212 and 216c can make electrical connections with the printed circuit board through wire bonds.

Referring back to FIG. 1, in another implementation, actions 180, 182, 185, 188B, 190B and 192B indicated in flowchart 100 are sufficient to describe one implementation of the present inventive concepts, other implementations of the present inventive concepts may utilize actions different from those shown in flowchart 100. Moreover, structures 280, 282, 385, 388B, 390B and 392B in FIGS. 2A, 2B, 3A-i/3A-ii, 3B, 3C and 3D illustrate the results of performing actions 180, 182, 185, 188B, 190B and 192B of flowchart 100, respectively. For example, structure 280 is a portion of an exemplary structure for reducing substrate effects in monolithically integrated RF circuits through layer transfer to front side glass after processing action 180, structure 282 is a portion of an exemplary structure for reducing substrate effects in monolithically integrated RF circuits through layer transfer to front side glass after the processing of action 182, structure 385 is a portion of an exemplary structure for reducing substrate effects in monolithically integrated RF circuits through layer transfer to front side glass after the processing of action 185, and so forth.

Figure 3B:
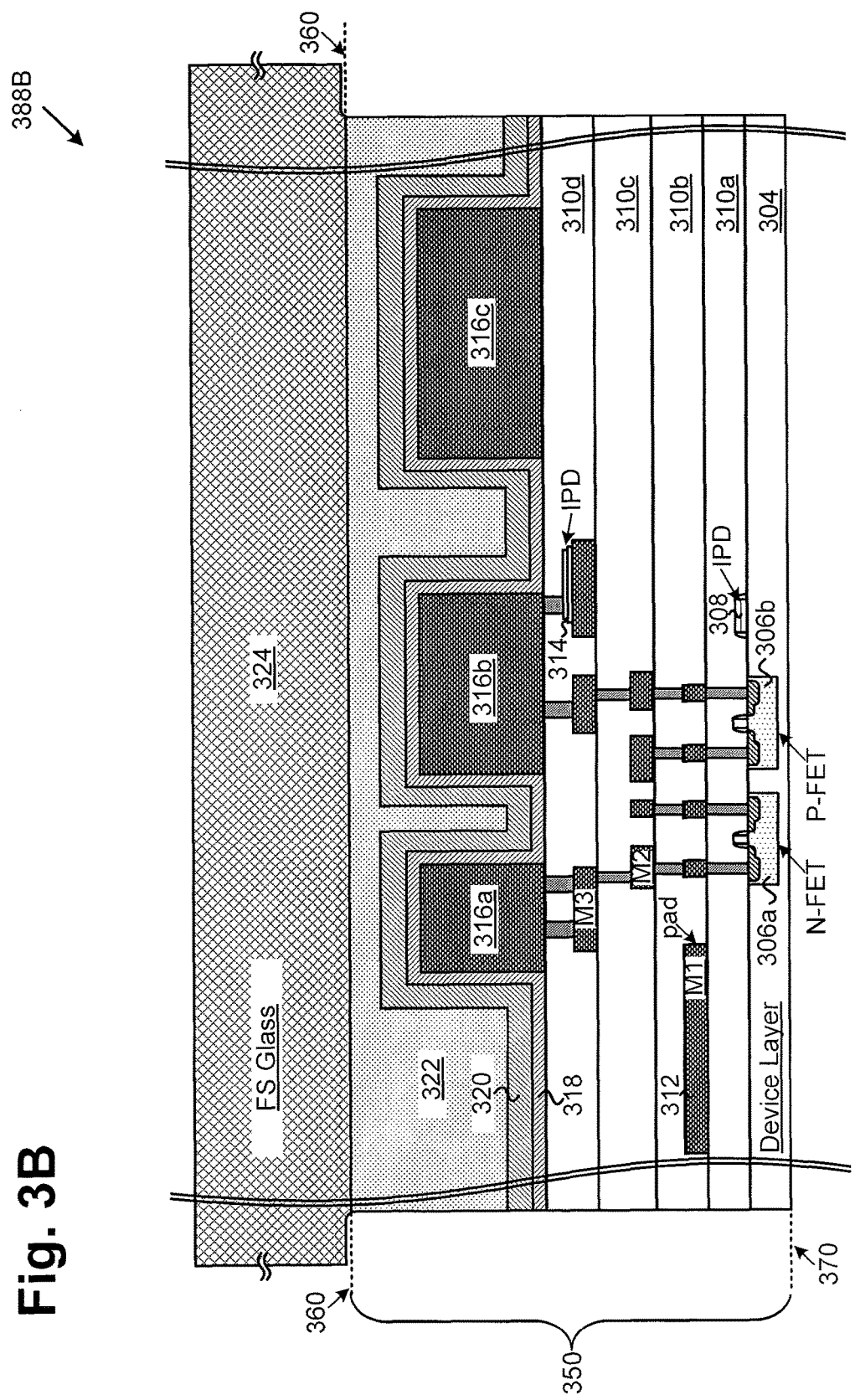

Referring to action 185 in FIG. 1 and structure 385 in FIGS. 3A-i and 3A-ii, action 185 includes removing an outer perimeter of the semiconductor wafer by edge grinding or dry etching, and grinding a back side of the semiconductor wafer to partially remove the handle substrate. The result of action 185 is illustrated by reference to FIGS. 3A-i and 3A-ii. FIG. 3A-i illustrates a top plan view of a back side of an exemplary structure for reducing substrate effects in monolithically integrated RF circuits through layer transfer to front side glass after the processing of action 185 in flowchart 100 of FIG. 1, according to one implementation of the present application. FIG. 3A-ii illustrates a cross-sectional view of a portion of an exemplary structure for reducing substrate effects in monolithically integrated RF circuits through layer transfer to front side glass after the processing of action 185 in flowchart 100 of FIG. 1, according to one implementation of the present application. It should be understood that prior to performing action 185 of flowchart 100, structure 385 may undergo actions 180 and 182, the results of which may be substantially the same as those shown in structure 280 in FIG. 2A and structure 282 in FIG. 2B (with similar numerals representing similar features), respectively, thus omitted for brevity.

As illustrated in FIG. 3A-i, structure 385 includes handle substrate 302 of semiconductor wafer 350, and edge grind trench 325 on back side 370 of semiconductor wafer 350. Edge grind trench 325 is on the outer perimeter of semiconductor wafer 350. As can be seen in FIG. 3A-i, edge grind trench 325 extends through handle substrate 302, device layer 304 (as shown in FIG. 3A-ii) and into front side glass 324. In one implementation, edge grind trench 325 may be formed by edge grinding from back side 370 of semiconductor wafer 350. In another implementation, edge grind trench 325 may be formed by dry etching the outer perimeter of structure 385.

FIG. 3A-ii illustrates an exemplary cross-sectional view of structure 385 along line 3A-ii in FIG. 3A-i after completion of action 185 in flowchart 100 of FIG. 1. As illustrated in FIG. 3A-ii, structure 385 includes semiconductor wafer 350 having handle substrate 302, device layer 304 having NFET 306a and PFET 306b, IPD 308, dielectric layers 310a, 310b, 310c and 310d, contact pad 312, and IPD 314. Semiconductor wafer 350 also includes various patterned interconnect metal layers and conductive vias in dielectric layers 310a, 310b, 310c and 310d, and contact pads 316a, 316b and 316c for external connections. Front side 360 of semiconductor wafer 350 is covered with passivation layers 318 and 320. In addition, oxide layer 322 is deposited and optionally planarized over front side 360 of semiconductor wafer 350 before front side glass 324 is formed thereon.

As illustrated in FIG. 3A-ii, edge grind trench 325 extends through handle substrate 302, device layer 304, dielectric layers 310a, 310b, 310c and 310d, passivation layers 318 and 320, oxide layer 322, and into front side glass 324. Edge grind trench 325 can be formed by, for example, grinding the outer perimeter of semiconductor wafer 350. As a result of forming edge grind trench 325, front side glass 324 is exposed on the outer perimeter of structure 385. It should be noted that edge grind trench 325 is on the outer perimeter of semiconductor wafer 350, and spaced relatively far away from NFET 306a, PFET 306b, IPD 308, contact pad 312, IPD 314 and contact pads 316a, 316b and 316c, as indicated by the double squiggle lines. As such, NFET 306a, PFET 306b, IPD 308, contact pad 312, IPD 314 and contact pads 316a, 316b and 316c within the enclosure formed by edge grind trench 325 remain unaffected by the edge grind. As illustrated in FIG. 3A-ii, handle substrate 302 is partially removed from back side 370 of semiconductor wafer 350. In one implementation, handle substrate 302 may be removed by, for example, back side grinding.

FIG. 3A-iii illustrates a cross-sectional schematic view of a portion of an exemplary structure for reducing substrate effects in monolithically integrated RF circuits through layer transfer to front side glass processed in accordance with an intermediate action in the flowchart of FIG. 1 according to one implementation of the present application. As illustrated in FIG. 3A-iii, structure 387 shows the edge profile of edge grind trench 325 extending from back side 370 of semiconductor wafer 350 to front side glass 324. The edge profile is configured to decrease the chance of edge cracking and/or bending, and improve mechanical integrity and flatness of structure 387.

Referring to action 188B in FIG. 1 and structure 388B in FIG. 3B, action 188B includes completely removing the remaining portion of the handle substrate. Referring to FIG. 3B, structure 388B illustrates a cross-sectional view of a portion of an exemplary structure for reducing substrate effects in monolithically integrated RF circuits through layer transfer to front side glass after the processing of action 188B in flowchart 100 of FIG. 1, according to one implementation of the present application. As illustrated in FIG. 3B, with similar numerals representing similar features shown in structure 288A in FIG. 2E, the remaining portion of handle substrate 302 as shown in FIG. 3A-ii is removed from structure 388B, for example, by etching. It is noted that structure 388B in FIG. 3B is substantially similar to structure 288A in FIG. 2E, except structure 388B has a different edge profile as shown in FIG. 3A-iii.

Referring to action 190B in FIG. 1 and structure 390B in FIG. 3C, action 190B includes forming a thermally conductive but electrically isolating layer on the back side of the semiconductor wafer. Referring to FIG. 3C, structure 390B illustrates a cross-sectional view of a portion of an exemplary structure for reducing substrate effects in monolithically integrated RF circuits through layer transfer to front side glass after the processing of action 190B in flowchart 100 of FIG. 1, according to one implementation of the present application. As illustrated in FIG. 3C, with similar numerals representing similar features shown in structure 290A in FIG. 2F, structure 390B includes thermally conductive but electrically isolating layer 326 on back side 370 of semiconductor wafer 350. It is noted that structure 390B in FIG. 3C is substantially similar to structure 290A in FIG. 2F, except structure 390B has a different edge profile as shown in FIG. 3A-iii.

Figure 3D:
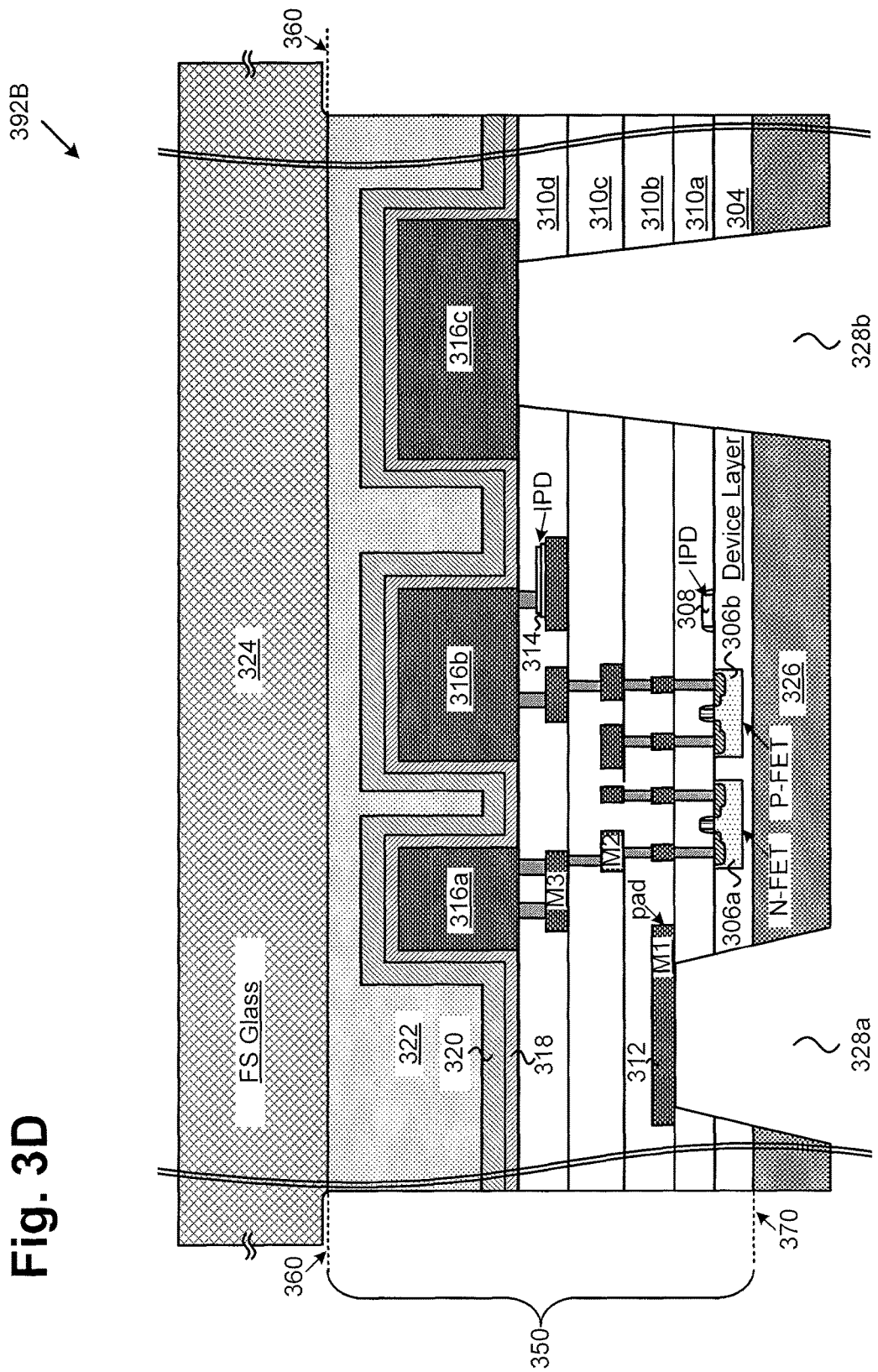

Referring to action 192B in FIG. 1 and structure 392B in FIG. 3D, action 192B includes forming at least one back side pad opening on the back side of the semiconductor wafer. Referring to FIG. 3D, structure 392B illustrates a cross-sectional view of a portion of an exemplary structure for reducing substrate effects in monolithically integrated RF circuits through layer transfer to front side glass after the processing of action 192B in flowchart 100 of FIG. 1, according to one implementation of the present application. As illustrated in FIG. 3D, with similar numerals representing similar features shown in structure 292A in FIG. 2G, structure 392B includes back side pad openings 328a and 328b on back side 370 of semiconductor wafer 350. It is noted that structure 392B in FIG. 3D is substantially similar to structure 292A in FIG. 2G, except structure 392B has a different edge profile as shown in FIG. 3A-iii.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of forming a semiconductor structure, said method comprising:
    forming a semiconductor wafer having a device layer situated over a handle substrate, said device layer having at least one semiconductor device;
    forming a front side glass on a front side of said semiconductor wafer;
    removing an outer perimeter of said semiconductor wafer including a first portion of said handle substrate and a first portion of said device layer from a back side of said semiconductor wafer;
    removing a remaining portion of said handle substrate.

2. The method of claim 1 wherein said front side glass is coupled to said front side of said semiconductor wafer by oxide fusion bonding.

3. The method of claim 1 wherein said removing said outer perimeter of said semiconductor wafer comprises edge grinding.

4. The method of claim 1 wherein said removing said remaining portion of said handle substrate comprises completely removing said handle substrate.

5. The method of claim 1 further comprising forming at least one pad opening extending from said back side of said semiconductor wafer to a contact pad.

6. The method of claim 1 wherein said handle substrate comprises a silicon on insulator substrate.

7. The method of claim 1 further comprising forming a thermally conductive but electrically isolating layer on said back side of said semiconductor wafer.

8. The method of claim 7 wherein said thermally conductive but electrically isolating layer replaces said handle substrate so as to substantially eliminate parasitic capacitance in said semiconductor structure.

9. The method of claim 7 wherein said thermally conductive but electrically isolating layer is configured to dissipate heat from said at least one semiconductor device.

10. The method of claim 7 wherein said thermally conductive but electrically isolating layer is selected from the group consisting of aluminum nitride, beryllium oxide, and aluminum oxide.

11. The method of claim 7 wherein said thermally conductive but electrically isolating layer is thermally coupled to said at least one semiconductor device situated in said device layer.

12. The method of claim 7 wherein said thermally conductive but electrically isolating layer has a coefficient of thermal expansion that is closely matched with that of said device layer.

13. The method of claim 1 wherein said at least one semiconductor device comprises at least one of a complementary-metal-oxide-semiconductor (CMOS) device and a bipolar complementary-metal-oxide-semiconductor (BiCMOS) device.

14. The method of claim 1 wherein said semiconductor structure comprises an oxide layer between said front side glass and said semiconductor wafer.

15. The method of claim 1 wherein said at least one semiconductor device is electrically coupled to a contact pad on said front side of said semiconductor wafer.

16. The method of claim 1 wherein said semiconductor wafer comprises a contact pad in a dielectric layer over said device layer.

17. The method of claim 1 wherein said device layer comprises silicon or silicon germanium.

18. The method of claim 1 wherein said semiconductor wafer comprises an integrated passive device (IPD).

19. The method of claim 1 wherein said removing said outer perimeter of said semiconductor wafer comprises dry etching.

* * * * *